US012571817B2

(12) United States Patent
Gravermann et al.

(10) Patent No.: US 12,571,817 B2
(45) Date of Patent: Mar. 10, 2026

(54) SENSORED INSULATION PLUG WITH DETECTION CONTACT

(71) Applicant: 3M INNOVATIVE PROPERTIES COMPANY, St. Paul, MN (US)

(72) Inventors: Mark Gravermann, Erkelenz (DE); Gunther A. J. Stollwerck, Krefeld (DE); Christopher R. Wilson, Austin, TX (US); Rainer Reeken, Dormagen (DE); Martin A. Milek, Oberhausen (DE); Christine B. Bund, Wuppertal (DE); Mirco Gunjaca, Nottuln (DE)

(73) Assignee: 3M Innovative Properties Company, St. Paul, MN (US)

( * ) Notice: Subject to any disclaimer, the term of this patent is extended or adjusted under 35 U.S.C. 154(b) by 179 days.

(21) Appl. No.: 18/562,096

(22) PCT Filed: May 11, 2022

(86) PCT No.: PCT/IB2022/054400
§ 371 (c)(1),
(2) Date: Nov. 17, 2023

(87) PCT Pub. No.: WO2022/254265
PCT Pub. Date: Dec. 8, 2022

(65) Prior Publication Data
US 2025/0004016 A1 Jan. 2, 2025

(30) Foreign Application Priority Data
Jun. 4, 2021 (EP) ..................................... 21177683

(51) Int. Cl.
| | |
|---|---|
| *G01R 15/04* | (2006.01) |
| *G01R 19/00* | (2006.01) |
| *H01R 13/66* | (2006.01) |

(52) U.S. Cl.
CPC ......... *G01R 15/04* (2013.01); *G01R 19/0084* (2013.01); *H01R 13/6683* (2013.01)

(58) Field of Classification Search
CPC ........ G01R 15/00; G01R 15/04; G01R 15/06; G01R 15/14; G01R 19/00; G01R 19/0084;
(Continued)

(56) References Cited

U.S. PATENT DOCUMENTS

| | | | |
|---|---|---|---|
| 3,513,253 A | 5/1970 | Woods |
| 3,868,164 A | 2/1975 | Lisk |
(Continued)

FOREIGN PATENT DOCUMENTS

| | | |
|---|---|---|
| DE | 1516128 C3 | 5/1978 |
| DE | 19855528 A1 | 6/2000 |
(Continued)

OTHER PUBLICATIONS

Extended European Search Report received for EP Application No. 21177683.6, mailed on Dec. 17, 2021, 2 pages.
(Continued)

*Primary Examiner* — Hoai-An D. Nguyen
(74) *Attorney, Agent, or Firm* — Gregg H. Rosenblatt

(57) ABSTRACT

Sensored insulation plug for a medium voltage or high-voltage separable connector in a national grid, and operable to insulate a connection element of the separable connector on an elevated voltage and to simultaneously detect and sense the elevated voltage. The sensored insulation plug comprises a) a plug body formed by a solidified insulating material, b) an externally accessible detection contact, c) a primary capacitor, operable as a high-voltage capacitor in a sensing voltage divider for sensing the elevated voltage, the primary capacitor having i) a high-voltage electrode; ii) a sensing electrode embedded in the plug body; iii) a dielectric
(Continued)

formed by a first portion of the insulating material, and d) a testpoint capacitor, operable as a high-voltage capacitor in a detection voltage divider for detecting the elevated voltage and comprising i) the high-voltage electrode, ii) a testpoint electrode, embedded in the plug body and electrically connected to the detection contact, and iii) a dielectric formed by a second portion of the insulating material.

13 Claims, 5 Drawing Sheets

(58) Field of Classification Search
CPC .............. G01R 19/0092; G01R 19/145; G01R 19/155; G01R 15/16; H01R 13/00; H01R 13/46; H01R 13/53; H01R 13/66; H01R 13/665; H01R 13/6683
USPC ................................................ 324/76.11, 157
See application file for complete search history.

(56) References Cited

U.S. PATENT DOCUMENTS

| | | | |
|---|---|---|---|
| 4,152,643 | A | 5/1979 | Schweitzer, Jr. |
| 6,031,368 | A | 2/2000 | Klippel et al. |
| 6,843,685 | B1 | 1/2005 | Borgstrom et al. |
| 8,968,027 | B2 | 3/2015 | Garabieta Artiagoitia et al. |
| 10,845,392 | B2 | 11/2020 | Siebens |
| 2005/0142941 | A1 | 6/2005 | Borgstrom et al. |
| 2020/0088772 | A1 | 3/2020 | Rumrill |
| 2021/0018537 | A1 | 1/2021 | Bauer |
| 2023/0305039 | A1 | 9/2023 | Gravermann et al. |
| 2023/0361503 | A1 * | 11/2023 | Gravermann .......... G01R 15/16 |

FOREIGN PATENT DOCUMENTS

| | | | |
|---|---|---|---|
| EP | 0691721 | B1 | 8/1998 |
| EP | 0980003 | B1 | 3/2006 |
| EP | 3517982 | A1 | 7/2019 |
| EP | 2696206 | B1 | 11/2023 |
| EP | 3298417 | B1 * | 10/2024 ............. G01R 15/16 |
| WO | 2020070605 | A1 | 4/2020 |

OTHER PUBLICATIONS

International Search Report received for PCT International Application No. PCT/IB2022/054400, mailed on Sep. 6, 2022, 4 pages.

* cited by examiner

SENSORED INSULATION PLUG WITH DETECTION CONTACT

FIELD

This disclosure relates to insulation plugs for separable connectors in medium-voltage and high-voltage power distribution networks. In particular, it relates to such plugs that have a voltage detection feature. The disclosure also relates to power distribution networks with separable connectors having such plugs installed therein.

BACKGROUND

Power distribution networks transmitting electrical power in large geographic areas, such as national grids, are becoming more complex to operate because nowadays consumers can generate energy on their premises and feed it into these networks in a decentralized manner, at unpredictable times and in unpredictable amounts. Network operators place voltage sensing devices in electrical installations at key locations of their network, such as in switchgears or transformers to collect information about the current state of their power network.

In a medium-voltage or high-voltage power distribution network, a power cable is typically connected to network apparatus, such as switchgears or transformers, by a separable connector, also often referred to as a removable power connector, mounted at the end of the cable. Such separable connectors have a front cavity to receive a protruding portion of a bushing of the apparatus, and a connection element on high or medium voltage. The connection element is in electrical contact with the cable conductor and can be mechanically and electrically connected to the bushing, e.g. via a threaded stud accessible through an opposed rear cavity of the separable connector. After installation, the rear cavity is filled by inserting a so-called insulation plug, which insulates the connection element.

Elements of a voltage sensor for measuring the voltage of the connection element of a separable connector—and thereby the voltage of the power cable—can be integrated into the insulation plug, making it a "sensored insulation plug". A voltage sensor of that type is described, for example, in the U.S. Pat. No. 6,031,368.

In order to sense the voltage of the connection element with high accuracy, a capacitive voltage divider (a "sensing voltage divider") may be used, of which the dividing ratio is precisely known. The high-voltage portion of such a sensing voltage divider is often a single capacitor, the primary capacitor or the "high-voltage capacitor". Advantageously the primary capacitor, or the entire high-voltage portion, is accommodated in the sensored insulation plug, making use of the insulative properties of the body of the insulation plug.

In such capacitive sensing voltage dividers, the set of dividing capacitors is exposed to the elevated voltage of the power conductor and divides that elevated voltage, either in fewer and larger steps via a small number of capacitors having higher voltage ratings, or in more, smaller steps via a greater number of capacitors having lower voltage ratings. Discrete capacitors that have both a high voltage rating and a larger capacity are generally rare and expensive. For dividing down an elevated voltage of tens of kilovolt, a larger number of discrete capacitors of high voltage rating, connected in series, would be required. Besides the cost, the space required to accommodate them is often prohibitive. Instead of many discrete capacitors, where a voltage sensor for elevated voltages requires a high voltage rating and a comparatively large capacity, an integrated capacitor can be used, i.e. a capacitor that is formed by structural elements of the insulation plug rather than by a separate, discrete electrical device.

Capacitors of the sensing voltage divider require adequate electrical insulation in order to reduce the risk of electrical discharges between any capacitor on a higher voltage and an element on lower voltage. Due to the strong electrical fields in the vicinity of the dividing capacitor(s) of the high-voltage portion of the voltage divider, the insulating material must be a good insulator and provide a high barrier to discharges. Any void or bubble in the insulating material may give rise to partial discharges.

Embedding capacitors of a medium-voltage/high-voltage (MV/HV) voltage divider in a body made of a solidified casting material is a proven method of obtaining a strong, mostly void-free electrical insulation, with the added benefit of mechanical rigidity of the body. When manufacturing such a body, a liquid, viscous, insulating casting material flows around the electrodes of integrated capacitors in a mold, filling all available space and thus reducing the risk of formation of voids. The casting material is then caused to cure and thereby solidify. The solidified insulating material forms the body of the sensored insulation plug.

For safety reasons, a sensored insulation plug may be required to comprise a voltage detector or a voltage test point, in addition to a sensing voltage divider. Such a voltage detector allows determination if the separable connector is energized or grounded, i.e. if elevated voltage is present or absent, before installation work is performed on the power network. No high degree of precision in voltage sensing is required for this detection.

Human installers in many countries worldwide use specific standardized tools (often referred to as hotstick measurement devices or hotsticks) to perform this detection in a safe manner. A hotstick is an insulating pole, usually made of fiberglass, that is used by electric utility workers when working on energized power lines to protect them from electric shock. A hook at the end of a hotstick can pull a grounded conductive cover away from the detection contact at the exposed end of an inserted insulation plug. Once the cover is removed, the detection contact can be contacted with a contact on the hotstick. The hotstick contains a capacitor that forms a capacitor of a voltage divider (the "detection voltage divider") for performing the voltage detection. Most hotsticks use floating ground capacity as a second capacity of the detection voltage divider. Via the detection voltage divider, battery-powered electronics in the hotstick can detect if elevated voltage is present in the separable connector—and hence on the power cable—or not, and will provide a corresponding visual indication to the hotstick operator. Alternatively, a non-contact voltage indicator that senses the electric field may be used to detect the presence or absence of elevated voltage.

It is desirable for a sensored insulation plug to be useable with such standardized tools for performing voltage detection. It appears desirable to facilitate simple and local voltage detection while high-precision monitoring of the voltage continues. It is also desirable to manufacture reliable sensored insulation plugs for use with such standardized detection tools in a cost-effective manner.

SUMMARY

In an attempt to address these needs the present disclosure provides a sensored insulation plug for being inserted into a rear cavity of a medium voltage or high-voltage separable connector in a power distribution network of a national grid, and operable to insulate a connection element of the separable connector on an elevated voltage and to sense the elevated voltage, the sensored insulation plug comprising a) a plug body formed by a solidified insulating material, b) an externally accessible detection contact, c) a primary capacitor, operable as a high-voltage capacitor in a sensing voltage divider for sensing the elevated voltage, the primary capacitor having i) a high-voltage electrode for direct electrical connection to the elevated voltage; ii) a sensing electrode of a tubular shape, embedded in the plug body; and iii) a dielectric formed by a first portion of the insulating material arranged between the sensing electrode and the high-voltage electrode, and d) a testpoint capacitor, operable as a high-voltage capacitor in a detection voltage divider for detecting the elevated voltage and comprising i) the high-voltage electrode, ii) a testpoint electrode, embedded in the plug body and electrically connected to the detection contact, and iii) a dielectric formed by a second portion of the insulating material arranged between the testpoint electrode and the high-voltage electrode.

Due to the presence of two separate capacitors in the sensored insulation plug, of which one, the testpoint capacitor, is connected to the detection contact, simultaneous voltage measurements can be carried out at two different levels of accuracy. The testpoint capacitor, with its testpoint electrode being connected to the externally accessible detection contact, allows the use of standardized tools for performing voltage detection, such as hotsticks. The presence of the test point capacitor in addition to the primary capacitor facilitates voltage detection at comparatively low accuracy while higher-precision voltage sensing via the primary capacitor can continue. Embedding both the sensing electrode and the testpoint electrode in the plug body allows for a cost-effective production of the sensored insulation plug.

The present disclosure relates to voltage sensing devices for use in medium-voltage or high-voltage power distribution networks in which electrical power is distributed over large geographic areas via HV/MV power cables, transformers, switchgears, substations etc. with currents of tens or hundreds of amperes and voltages of tens of kilovolts. The term "medium voltage" or "MV" as used herein refers to AC voltages in the range of 1 kilovolt (kV) to 72 kV, whereas the term "high voltage" or "HV" refers to AC voltages of more than 72 kV. Medium voltage and high voltage are collectively referred to herein as "elevated voltage".

Many separable connectors are T-shaped or elbow-shaped. A separable connector as referred to herein usually has a front cavity to receive a protruding portion of a bushing of the switchgear or the transformer, and an opposed rear cavity facilitating access to a connection element, such as a cable lug, on elevated voltage inside the separable connector. The connection element is conductive and is electrically and mechanically connected to the power conductor of the power cable. The connection element can be connected mechanically and electrically, e.g. by a conductive threaded stud, to a conductive element of the bushing, so that power can flow from the power cable through the connection element, the stud and the bushing into the switchgear or transformer. When the separable connector is in use, the connection element is on the elevated voltage of the power conductor of the cable.

Certain separable connectors are described in the European patent application EP 0 691 721 A1. Examples of traditional separable connectors are the 3M™ 600 Amp T-Bodies 5815 Series from 3M Co., St. Paul, Minnesota, U.S.A., or the "(M) (P) 480 TB separable tee shape connector" of Nexans Network Solutions N.V., Erembodegem, Belgium.

The rear cavity of a separable connector can receive a matching insulation plug to insulate the connection element and to fill the space of the rear cavity to reduce the risk of electrical discharges. Such matching pairs of separable connector and insulation plug are commercially available at moderate cost. In many cases, the mechanical interface between a separable connector and an insulation plug is governed by de-facto standards. Many of such interfaces conform to an existing standard for bushings, some form a Type C interface as described in the German standards DIN EN 50180 for bushings and DIN EN 50181 for plug-in type bushings, others conform to IEEE standard 386. Often, bodies of insulation plugs are slightly larger than the rear cavity, so that after the plug is urged into the rear cavity with some force, the surfaces of plug and cavity are in an intimate surface contact, thus reducing the risk of electrical discharges.

The body of a sensored insulation plug according to the present disclosure is shaped for mating with a rear cavity of a separable connector in the same way as the body of a non-sensored insulation plug. The plug body may be rotationally symmetric about a plug axis. The body of the sensored insulation plug may, for example, have a frusto-conical shape for being inserted into a corresponding frusto-conical recess of corresponding shape (the rear cavity) at a rear side of the separable connector, thereby mating the sensored insulation plug with the separable connector.

A connection element of a separable connector is electrically connected to the conductor of the power cable terminated by the separable connector and is on elevated voltage when the cable is in use.

Some separable connectors comprise a connection element such as a cable lug, attached to the end of the central conductor of the power cable and protruding into a space between the front cavity and the rear cavity. The protruding portion of the connection element usually has an aperture or a thread for attachment to a stud or screw which connects the connection element electrically and mechanically, e.g. with a conductor of a bushing.

The connection element of the separable connector serves to electrically and mechanically connect the power cable and the separable connector to a bushing. The high-voltage electrode of the primary capacitor of the sensored insulation plug as described herein is—when in use—directly electrically connected to the connection element, so that a voltage sensor based on a voltage divider comprising the primary capacitor in its high-voltage portion, or a voltage detector based on a voltage divider comprising the testpoint capacitor in its high-voltage portion, can sense or detect the elevated voltage of the connection element and thereby the elevated voltage of the power cable conductor, after connection of the power cable to the bushing.

As used herein, "sense" and "sensing" refer to a higher-precision measurement of the elevated voltage, while "detect" and "detection" refer to a lower-precision determination if elevated voltage is present or absent.

The primary capacitor is operable as a high-voltage capacitor in a first voltage divider (the "sensing voltage divider") for sensing the elevated voltage with a higher degree of precision. The connection element is electrically connected to the sensing voltage divider such that the sensing voltage divider is usable to sense the elevated voltage of the connection element. For that purpose, the connection element on elevated voltage is electrically connected to the high-voltage electrode of the primary capacitor in the sensed insulation plug which in turn is operable as a high-voltage capacitor in the sensing voltage divider for sensing the elevated voltage.

Similarly, the testpoint capacitor is operable as a high-voltage capacitor in a second voltage divider (the "detection voltage divider") for detecting the elevated voltage. The connection element is electrically connected to the detection voltage divider such that the detection voltage divider is usable to detect the elevated voltage of the connection element. For that purpose, the connection element on elevated voltage is electrically connected to the high-voltage electrode of the detection capacitor in the sensed insulation plug which in turn is operable as a high-voltage capacitor in the detection voltage divider for detecting the elevated voltage.

The high-voltage electrode of the primary capacitor is also an electrode of the testpoint capacitor. The high-voltage electrode is thus comprised both in the primary capacitor and in the testpoint capacitor. Thereby, the elevated voltage of the high-voltage electrode can simultaneously be sensed, with high accuracy, by the sensing voltage divider, and be detected, with lower accuracy, by the detection voltage divider.

The high-voltage electrode of a sensored insulation plug according to the present disclosure is arranged in the high-voltage end portion of the insulation plug, as described below. A portion of the high-voltage electrode, or a portion of a contact piece is exposed and externally accessible for establishing an electrical connection to the connection element of the separable connector.

In use, the high-voltage electrode may be not only electrically, but also mechanically connected to the connection element of the separable connector. This mechanical connection advantageously is an electrically conductive connection. The mechanical connection may be a direct mechanical connection, i.e. a portion of the high-voltage electrode is mechanically connected to the connection element without any intermediate element.

Alternatively, this connection may be an indirect mechanical connection, i.e. in use a portion of the high-voltage electrode is connected to the connection element via an intermediate element, which is electrically conductive. The sensored insulation plug may thus further comprise an intermediate element which is operable to mechanically and electrically connect the high-voltage electrode with the connection element. Such an intermediate element may be, for example, a contact piece. Such a contact piece may be connectable to the connection element of the separable connector, for example via a conductive threaded stud or screw that is threadedly connected to the contact piece on one side and that can, on the other side, be threadedly engaged with the connection element of the sensored insulation plug.

Hence in certain embodiments the sensored insulation plug further comprises a contact piece, operable to mechanically and electrically connect the high-voltage electrode with the connection element of the separable connector.

A contact piece of the sensored insulation plug according to the present disclosure may be the high-voltage-electrode, or it may comprise the high-voltage electrode. Where the contact piece comprises the high-voltage electrode, the contact piece may have an engagement portion to engage with an intermediate element connecting the contact piece electrically with the connection element of the separable connector, and an electrode portion forming the high-voltage electrode. The engagement portion and the electrode portion may be formed as a single piece, e.g. as a single piece of metal. Alternatively, they may be formed as separate elements.

The contact piece, or an engagement portion of the contact piece, may comprise a recess to connectingly engage a stud that is connected to the connection element of the separable connector. The contact piece, or an engagement portion of the contact piece, may comprise an internal or external thread to connectingly and threadedly engage a threaded stud that is connected to the connection element of the separable connector.

In certain preferred embodiments, the sensing electrode is shaped and arranged such as to be generally rotationally symmetric about the plug axis of the sensored insulation plug, and the high-voltage electrode is shaped and arranged such as to be generally rotationally symmetric about the plug axis of the sensored insulation plug. The high-voltage electrode and the sensing electrode may thus be arranged coaxially, or concentrically, with the sensing electrode being arranged around the high-voltage electrode. The sensing electrode being arranged around the high-voltage electrode implies that the sensing electrode, or at least an axial portion of the sensing electrode, is arranged radially outward from the high-voltage electrode and surrounds the high-voltage electrode.

Hence, in certain embodiments the plug body is rotationally symmetric about a plug axis, and the high-voltage electrode and the sensing electrode are arranged concentrically around the plug axis, and wherein the sensing electrode is arranged around the high-voltage electrode. The concentric arrangement helps provide for a reduced risk of electrical discharges. The arrangement of the sensing electrode around the high-voltage electrode may result in a larger capacitance of the primary capacitor and a higher sensing accuracy of the sensing voltage divider.

The expression "embedded in the plug body" as used herein refers to being surrounded completely by portions of the plug body. In particular, an electrode is considered embedded in the plug body if the plug body is cast or molded around the electrode. In a particular aspect, an element of the sensored insulation plug may be considered embedded in the plug body if a major portion, e.g. more than 90% or more than 95%, of its exterior surface is in surface contact with the solidified insulating material. Surface contact, however, is not a prerequisite for being considered "embedded", as an embedded element may, for example, be arranged in a cavity of the plug body without being in surface contact with the solidified insulating material.

The high-voltage electrode of the primary capacitor may be embedded in the plug body. A portion of an embedded high-voltage electrode, or an entire embedded high-voltage electrode, may be in surface contact with the insulating material of the plug body.

The sensing electrode of the primary capacitor is embedded in the plug body. A portion of the embedded sensing electrode, or the entire sensing electrode, may be in surface contact with the insulating material of the plug body.

The sensing electrode may be electrically connected, or connectable, to a low-voltage capacitor, such that the primary capacitor and the low-voltage capacitor form a voltage divider for sensing the elevated voltage of a connection element of a separable connector. The primary capacitor may be comprised in, or may form, the high-voltage portion of the voltage divider, while the low-voltage capacitor may be comprised in, or may form, the low-voltage portion of the voltage divider.

The plug body may have a generally rotationally symmetric outer shape. In order to be usable with many existing separable connectors the plug body may have a generally frustoconical outer shape, such that it can fill a frustoconical rear cavity of a separable connector without leaving too many or too large voids between the inner surface of the rear cavity and the outer surface of the plug body. The outer shape of the sensored insulation plug according to the present disclosure may be generally symmetric about a plug axis, e.g. rotationally symmetric about a plug axis. The plug axis may be an axis which is parallel to a design insertion direction, i.e. a direction in which the sensored insulation plug, by design, is supposed to be inserted into a separable connector. The plug axis defines axial directions, which are directions parallel to the plug axis, and radial directions, which are directions orthogonal to the axial directions.

In axial directions a sensored insulation plug and the plug body comprises a high-voltage end portion and, at an opposite end in axial directions, an opposed low-voltage end portion. The high-voltage end portion is close to the connection element of the separable connector once the sensored insulation plug is inserted into the rear cavity of the sensored insulation plug. Where the insulation plug is frustoconical, the high-voltage end portion is the smaller-diameter end portion, while the low-voltage end portion is the larger-diameter end portion, which normally protrudes from the rear cavity when the plug is inserted. The low-voltage end portion may have an axial end face. The axial end face of the low-voltage end portion may be oriented orthogonally to the plug axis and faces away from the high-voltage electrode and the contact piece of the sensored insulation plug.

At its low-voltage end portion the sensored insulation plug may have an engagement feature, e.g. of a hexagonal shape, protruding axially such that it can be engaged by a wrench to rotate the insulation plug and thereby to engage it with the connection element of the separable connector. The engagement feature may be arranged symmetrically around the plug axis. Where the engagement feature comprises a hexagonal shape, the centre of the hexagonal shape may be arranged on the plug axis.

In advantageous embodiments of the sensored insulation plug described herein the detection contact is arranged in the low-voltage end portion of the plug. The detection contact is externally accessible, e.g. accessible for electrical contact of a hotstick contact. The detection contact may be externally accessible, e.g. accessible for electrical contact of a hotstick contact, after removal of a detection contact cover. Generally, the detection contact may be arranged at an outer surface of the plug, e.g. at an axial end face, where it is particularly easy to access and to contact by a hotstick. Hence in certain embodiments the plug body comprises a high-voltage end portion and an opposed low-voltage end portion, and the detection contact is arranged at an axial end face of the low-voltage end portion.

Where the sensored insulation plug is rotationally symmetric, the detection contact may be arranged on the plug axis or close to the plug axis. The detection contact may be circular or annular. A circular or annular detection contact may be arranged symmetrically around the plug axis. In certain embodiments, the detection contact may be arranged in the engagement feature.

In some of the above-mentioned embodiments of the sensored insulation plug according to the present disclosure the detection contact is comprised in a conductive tube, extending from the axial end face along the plug axis towards an opposed high-voltage end portion of the plug body. An end portion of the conductive tube may comprise the detection contact. The conductive tube may be hollow, forming a cylindrical cavity. The conductive tube may be made of, or comprise, a conductive metal such as copper, aluminium, steel, or silver.

The detection contact being comprised in a conductive tube may be beneficial in that the interior of the tube forms a hollow space which may have other functions, like, for example, engage a detection contact cover as described below, or engage a contact of a hotstick. Also, the conductive tube may form a particularly rugged mechanical connection of the detection contact towards other elements of the sensored insulation plug embedded in the plug body. The conductive tube may, for example, mechanically and electrically connect the detection contact with the testpoint electrode embedded in the plug body.

The conductive tube may have a circular cross section. The conductive tube may be a cylindrical conductive tube. The cross section of the conductive tube is generally not limited, and other regular or irregular shapes are possible, too.

Alternatively, the detection contact may be comprised in a conductive rod, extending from an axial end face of the low-voltage end portion of the plug body along the plug axis towards the high-voltage end portion. An end portion of the conductive rod may comprise the detection contact. The conductive rod may be a solid conductive rod. The conductive rod may be made of, or comprise, a conductive metal such as copper, aluminium, steel, or silver. The detection contact being comprised in a conductive rod may be beneficial to provide a larger contact area for a hotstick contact. Also, the conductive rod may form an even stronger mechanical connection of the detection contact with other elements of the sensored insulation plug embedded in the plug body. The conductive rod may, for example, mechanically and electrically connect the detection contact with the testpoint electrode embedded in the plug body.

Advantageously the sensored insulation plug, and in particular the shape of the plug body of the sensored insulation plug, is adapted to conform to DIN EN 50180 or to DIN EN 50181, which are German industry standards for bushings. For use in other geographies it may be more advantageous that the sensored insulation plug, and in particular the shape of the plug body of the sensored insulation plug, is adapted to conform to industry standard IEEE 386. When referring to an industry standard herein, the latest version as in force on 20 May 2021 is meant, e.g. IEEE standard 386-2016, published 14 Oct. 2016, is deemed to be the latest version in force on 20 May 2021. Conformance to an industry standard, although not a requirement for sensored insulation plugs as described herein, may generally help obtain compatibility with a greater number of separable connectors.

Hence in certain embodiments the plug body is shaped such as to conform with the IEEE standard 386 in its latest version as in force on 20 May 2021.

The sensored insulation plug according to the present disclosure comprises a plug body formed by a solidified electrically insulating material. The shape of the plug body may generally determine the outer shape of the sensored insulation plug. For durability and for reliable functioning over years it is desirable that the plug body is mechanically rigid, has a high dielectric strength, has little variation of its relative permittivity with changes in temperature over the operating temperature range, does not absorb water, and does not age.

The insulating material is liquid during the manufacturing of the plug body and solidifies thereafter to form a rigid plug body. Solidification may be obtained by curing, hardening, crosslinking, or in other known manners. The insulating material may be, for example, a solidifiable, e.g. a hardenable or curable, liquid epoxy resin or a solidifiable, e.g. hardenable or curable, liquid mixture of an epoxy resin with other materials, such as fillers, or a solidifiable, e.g. hardenable or curable, polyurethane resin or a solidifiable, e.g. hardenable or curable, mixture of a polyurethane resin with other materials, such as fillers. Useful fillers are, for example, $SiO_2$ or $Al_2O_3$ or other electrically insulating inorganic materials. Alternatively, the insulating material may be or may comprise, for example, a ceramic material.

In certain embodiments the insulating material comprises an epoxy resin and, optionally, a filler, such as $SiO_2$ or $Al_2O_3$ or another electrically insulating inorganic material. Epoxy resins provide high electrical withstand, and much knowledge exists around molding or casting epoxy resins, furthermore these resins are available at moderate cost. Suitable fillers can help increase electrical withstand of the insulation material or to reduce its shrinkage upon solidifying. Where the insulation material is used as a dielectric in a capacitor, choosing a suitable filler may allow to adjust the coefficient of thermal expansion of the insulation material and thereby the variation of the capacitance of the primary capacitor with temperature.

The viscosity of the solidifiable insulating material in its liquid state is not critical, as long as it allows the liquid insulating material to be used, e.g. molded or cast, in known processes to form the plug body.

The primary capacitor of the sensored insulation plug described herein is operable as a high-voltage capacitor in a sensing voltage divider, which in use is electrically connected between the connection element on elevated voltage and electrical ground, for sensing the elevated voltage of the connection element of the separable connector. The sensing voltage divider comprises, in its high-voltage portion, the primary capacitor of the sensored insulation plug described herein.

Similarly, the testpoint capacitor of the sensored insulation plug described herein is operable as a high-voltage capacitor in a detection voltage divider, which in use is electrically connected between the connection element on elevated voltage and electrical ground, for detecting the elevated voltage of the connection element of the separable connector. The detection voltage divider comprises, in its high-voltage portion, the testpoint capacitor of the sensored insulation plug described herein.

The sensing voltage divider may be a capacitive voltage divider. In other words, both its high-voltage portion and its low-voltage portion (defined below) may each consist of one or more capacitors, respectively, and may be free of impedance elements of other types, such as resistors or inductances. In certain embodiments the sensing voltage divider is a mixed voltage divider, in which the high-voltage portion comprises, beyond the primary capacitor, an inductance or a resistor, and in which the low-voltage portion comprises a capacitor and/or an inductance and/or a resistor.

In certain embodiments, the high-voltage portion of the sensing voltage divider comprises, beyond the primary capacitor, a plurality of capacitors, such as ten, twenty, or thirty capacitors. While a greater number of capacitors helps stepping down the elevated voltage in smaller steps, arranging many capacitors linearly may result in the plug body being too short to accommodate this row of capacitors. To avoid this problem, a certain number of these capacitors can be replaced by a high-voltage resistor, according to the concept of the so-called Zaengl divider, known in other fields of electrical engineering.

Similarly, the detection voltage divider may be a capacitive voltage divider. Its high-voltage portion and its low-voltage portion (defined below) each consist of one or more capacitors, respectively, and are free of impedance elements of other types, such as resistors or inductances. In certain embodiments the detection voltage divider is a mixed voltage divider, in which the high-voltage portion comprises, beyond the testpoint capacitor, an inductance or a resistor, and in which the low-voltage portion comprises a capacitor and/or an inductance and/or a resistor.

As used herein, the high-voltage portion of a voltage divider is the portion that is electrically arranged between a signal contact, at which a divided voltage can be picked up, and a contact for connection to the elevated voltage which is to be sensed. The low-voltage portion of the voltage divider is the portion that is electrically arranged between that signal contact and a contact for connection of the voltage divider to electrical ground. The divided voltage varies proportionally with the elevated voltage, it is therefore also referred to herein as the "signal voltage". The dividing ratio, i.e. the proportionality factor between the elevated voltage and the signal voltage, depends on the ratio of the total impedance of the high-voltage portion to the total impedance of the low-voltage portion of the voltage divider. By measuring the signal voltage of the signal contact and applying the proportionality factor, the elevated voltage of the connection element can be sensed. A signal wire may be connected to the signal contact to lead the signal voltage to some measurement circuitry outside the sensored insulation plug.

The testpoint capacitor may be the only impedance element of the high-voltage portion of the detection voltage divider. In other words, there may be no other capacitor(s) and no other impedance elements electrically arranged between the elevated voltage and the signal contact of the detection voltage divider.

Independent of the number of capacitors in the detection voltage divider, the testpoint capacitor may be the first impedance element in an electrical chain of impedance elements of the detection voltage divider. In this chain, the testpoint capacitor may be arranged electrically at the end of the chain and may be adapted to be electrically connected directly with the elevated voltage. The testpoint capacitor would thus be the impedance element of the detection voltage divider which "sees" the full elevated voltage on the high-voltage electrode.

The primary capacitor may be directly electrically connected to the elevated voltage of the connection element, that is, the primary capacitor may be electrically connected to the connection element without any intermediate element. The testpoint capacitor may be directly electrically connected to the elevated voltage of the connection element, that is, the testpoint capacitor may be electrically connected to the connection element without any intermediate element. In particular, the high-voltage electrode of both the primary capacitor and the testpoint capacitor may be directly electrically connected to the elevated voltage, i.e. to the elevated voltage of the connection element. The high-voltage electrode may be directly electrically connected to the connection element. This direct electrical connection may be established, for example, through a contact piece, which is an electrically conductive mechanical element between the high-voltage electrode and the connection element of the separable connector.

Like most capacitors, the primary capacitor has two opposed electrodes (namely its high-voltage electrode and its sensing electrode) and a dielectric between the electrodes. The dielectric is formed by a first portion of the insulating material of the plug body in that some of the plug body's insulating material is arranged between the sensing electrode and the high-voltage electrode. More specifically, the dielectric may be formed by a first portion of the plug body in that some of the plug body's insulating material may be arranged between at least a portion of the sensing electrode and a portion of the high-voltage electrode.

Similarly, the testpoint capacitor has two opposed electrodes (namely the high-voltage electrode and the testpoint electrode) and a dielectric between these electrodes. The dielectric is formed by a second portion of the insulating material of the plug body in that some of the plug body's insulating material is arranged between the testpoint electrode and the high-voltage electrode. More specifically, the dielectric may be formed by a second portion of the plug body in that some of the plug body's insulating material may be arranged between at least a portion of the testpoint electrode and a portion of the high-voltage electrode.

The sensing electrode is generally of a tubular shape and is arranged around the high-voltage electrode, e.g. concentrically arranged around the high-voltage electrode, or at least around an axial portion of the high-voltage electrode. The sensing electrode of the primary capacitor may be connected to, or formed with, other components, e.g. components for support or electrical or mechanical connection of the sensing electrode, to form a sensing electrode assembly. Within a sensing electrode assembly, the sensing electrode is the element that is arranged opposite to the high-voltage electrode and that determines, in combination with the high-voltage electrode and the dielectric, the capacitance of the primary capacitor.

The sensing electrode may extend perpendicularly from a support platform supporting the sensing electrode. The support platform may be, or comprise, a circuit board, such as a printed circuit board ("PCB"). The support platform may comprise opposed major surfaces, parallel to each other and spaced from each other in a thickness direction. The support platform may be arranged such that its thickness direction extends parallel to the plug axis (i.e. in axial directions) of the sensored insulation plug and its major surfaces extend in radial directions.

Hence in certain embodiments the sensored insulation plug according to the present disclosure further comprises a circuit board, embedded in the plug body and supporting the sensing electrode. A circuit board is a cost-effective means to support the sensing electrode and/or its mesh mechanically. Also, such a circuit board facilitates the making of electrical connections of the sensing electrode to other elements, such as the signal contact, which may be arranged on the circuit board.

Turning now to the testpoint capacitor and its testpoint electrode: In certain embodiments the testpoint electrode is thin. "Thin" refers to the thickness of the testpoint electrode being much smaller, e.g. an order of magnitude smaller, than its greatest extension in any direction orthogonal to its thickness direction. A thin testpoint electrode may have the shape of a sheet, for example.

Hence, in certain embodiments, a thickness of the testpoint electrode is one tenth of its greatest extension in any direction orthogonal to its thickness direction or less. A thinner testpoint electrode occupies less space in the plug body and leaves thus more space to the insulating material, which improves electrical insulation and may make the sensored insulation plug more reliable. A thinner testpoint electrode may also be more conformable to the flow of liquid insulation material when the plug body is molded, resulting potentially in less voids in the insulation material after solidification and less risk of electrical discharges.

The testpoint electrode may be flat, i.e. it extends in a geometric plane. Where the testpoint electrode is thicker, it may comprise two opposed major surfaces, parallel to each other. A testpoint electrode is flat if both of these major surfaces lie in respective geometric planes. Where the testpoint electrode is thin, it may comprise two opposed major surfaces, parallel to each other and spaced from each other, and the spacing of the surfaces is one tenth or less of the extension of the major surfaces.

Hence in certain embodiments the testpoint electrode comprises two opposed major surfaces, parallel to each other and lying in respective geometric planes. The respective geometric planes may extend orthogonally to the plug axis.

A flat testpoint electrode may be easier and more cost-effective to manufacture and assemble. It may also be mechanically more stable when exposed to the flow of liquid insulating material during manufacturing of the plug body.

In certain embodiments the testpoint electrode is flat and thin. In such embodiments the testpoint electrode comprises two opposed major surfaces, parallel to each other and each lying in respective geometric planes, and a thickness of the testpoint electrode is one tenth or less of its greatest extension in these planes.

In certain embodiments the testpoint electrode is flat. In certain of these embodiments the testpoint electrode has a circular perimeter. The testpoint electrode may thus have the shape of a flat circular disk. The disk may have a diameter of between 1 centimeter (cm) and 10 cm. The disk may not be circular. In such cases the disk may have a greatest extension in any direction orthogonal to its thickness direction of between 1 centimeter (cm) and 10 cm Where the testpoint electrode is flat and thin, the testpoint electrode lies in a geometric plane, the "testpoint electrode plane". In certain embodiments the testpoint electrode plane extends orthogonally to the plug axis. In other words, the testpoint electrode plane is oriented such that a normal on the testpoint electrode plane is parallel to the plug axis. Hence in certain embodiments the plug body is rotationally symmetric about a plug axis, and the testpoint electrode extends in a plane orthogonal to the plug axis. This orientation allows for a centric arrangement of the testpoint electrode and may thus facilitate a more cost-effective and more consistent assembly of the sensored insulation plug. The centric arrangement may also allow for the testpoint electrode to be larger than it could be in other orientations, given the limited space in the plug body.

The testpoint electrode, however, does not need to be flat and can have other shapes. It may be, for example, bell-shaped, cup-shaped, convex-shaped or concave-shaped. Such curved shapes may be useful to achieve greater capacitances, where necessary.

In certain embodiments, the testpoint electrode is curved. Where the testpoint electrode is curved, its shape may be adapted such as to correspond to the shape of the high-voltage electrode. In particular, its shape may be adapted such as to correspond to the shape of an opposed portion of the outer surface of the high-voltage electrode. A surface portion of the testpoint electrode and a surface portion of the high-voltage electrode opposite to the surface portion of the testpoint electrode may thus be arranged parallel to each other. This may save space in the sensored insulation plug an may result in a greater capacitance of the testpoint capacitor.

In certain embodiments the testpoint electrode is arranged axially between the high-voltage electrode and the detection contact. Where the testpoint electrode is rotationally symmetric, it may be arranged such that its symmetry axis coincides with the plug axis. This symmetric arrangement may result in a more cost-effective assembly process.

The testpoint electrode is arranged spaced from the high-voltage electrode for these electrodes to form the testpoint capacitor. The shortest distance between any portion of the testpoint electrode and any portion of the high-voltage electrode determines the voltage withstand of the testpoint capacitor. In certain embodiments the shortest distance between any portion of the testpoint electrode and any portion of the high-voltage electrode is 3 millimeters (mm) or more. Such a spacing provides for an adequate voltage withstand and reduces the risk of electrical discharges between the electrodes. In certain of these embodiments the shortest distance between any portion of the testpoint electrode and any portion of the high-voltage electrode is 5 mm or more, in certain of these embodiments it is 10 mm or more.

Certain standards, such as IEEE standard 386, require the capacitance of the testpoint capacitor to be at least 1 picofarad (pF). In certain embodiments the capacitance of the testpoint capacitor is 1 pF or more. In certain of these embodiments the capacitance of the testpoint capacitor is 10 pF or more. The compliance with standards makes the sensored insulation plug according to the present invention more versatile to use.

The dielectric of the testpoint capacitor is formed by a portion of the insulating material of which the plug body is formed. The dielectric is thus formed by the same solidified insulating material, e.g. a resin, that forms the plug body. The testpoint electrode is embedded in the plug body and is therefore surrounded completely by the solidified insulating material. A portion of the embedded testpoint electrode, or the entire embedded testpoint electrode, may be in surface contact with the insulating material of the plug body.

In certain embodiments the testpoint electrode comprises a conductive sheet, such as a metal sheet, comprising a plurality of apertures to allow portions of the insulating material on opposite sides of the sheet to be mechanically connected with each other by insulating material in the apertures while the insulating material solidifies and thereafter. This connection helps avoid delamination between the testpoint electrode and the insulating material after molding, e.g. when the temperature varies. The connection can also reduce the risk of formation of voids in the insulating material during molding, because through the apertures of the mesh the insulation material, while still liquid, can more easily fill all volumes in the plug body.

In certain embodiments the testpoint electrode comprises a mesh of conductive wires forming a plurality of apertures between the wires to allow portions of the insulating material on opposite sides of the mesh to be mechanically connected with each other by insulating material in the apertures while the insulating material solidifies and thereafter. As stated above for the sheet, this connection helps avoid delamination between the testpoint electrode and the insulating material after molding, e.g. when the temperature varies. The connection can also reduce the risk of formation of voids in the insulating material during molding, because through the apertures of the mesh the insulation material, while still liquid, can more easily fill all volumes in the plug body.

A testpoint electrode may comprise a mesh of conductive wires or a conductive sheet forming apertures or both. A testpoint electrode may consist of a mesh of conductive wires or of a conductive sheet forming apertures.

The conductive wires forming the mesh may be connected with each other, e.g. by weaving the wires or by knotting or looping the wires, to provide electric connection and some mechanical stability. Hence the mesh may be a woven mesh or a knotted mesh or a looped mesh.

The mesh of conductive wires may be a deformable mesh. A deformable mesh may follow, to some degree, the flow of liquid insulating material when the plug body is manufactured. This is believed to reduce the likelihood of delamination of the insulating material from the mesh.

Deformability of the mesh originates, amongst other factors, from the conformability or ductility of the wires forming the mesh. Thinner wires of a ductile material will tend to form a more deformable mesh, while thicker wires of a rigid material will tend to form a more rigid, less deformable mesh. Wires of a suitable material and of thicknesses (diameters) of between 0.05 millimeter (mm) and 1 mm are considered suitable to yield a deformable mesh, and wire thicknesses between 0.1 mm and 0.5 mm have been found particularly useful. In certain embodiments the wires have a diameter of between 0.05 mm and 1 mm.

The softness or the rigidity of the materials of the wires also has an impact on the deformability of the mesh. Wires of a suitable thickness and of a ductile copper, gold or silver material are considered suitable to yield a deformable mesh. Suitable deformable meshes can, for example, be obtained using wires of stainless steel having a shear modulus, at room temperature, of about 80 giga pascal (GPa), or wires of copper having a shear modulus of about 45 GPa.

A flat mesh, for example, that comprises a portion of its outer surface which is radially deformed by at least 1 mm by a steel ball of 50 grams of weight laid on that portion is considered deformable. As opposed to that, a flat mesh, for example, that is deformed by less than 0.5 mm by a steel ball of 50 grams of weight laid on any portion of the outer surface of the mesh is not considered deformable.

The wires of the mesh may be copper wires, silver wires, aluminium wires, or stainless-steel wires, for example. More generally, the wires of the deformable mesh may comprise, for example, copper, silver, gold, aluminium, or stainless steel, or combinations or mixtures or alloys of two or more of these metals.

Where the testpoint electrode comprises a mesh of conductive wires forming apertures between the wires, or where the testpoint electrode comprises a conductive sheet comprising a plurality of apertures, the apertures allow portions of the insulating material on opposite sides of the mesh or sheet to be mechanically connected with each other by insulating material in the apertures while the insulating material solidifies and thereafter. A liquid insulating material can flow into the apertures, so that insulating material in the apertures mechanically connects a portion of the insulating material on one side of the mesh/sheet with a portion of the insulating material on the opposite side of the mesh/sheet, both during and after solidification. Hence in certain embodiments, at least one aperture of the plurality of the apertures is filled with insulating material mechanically connecting portions of the insulating material on opposite sides of the mesh/sheet with each other.

Where the testpoint electrode comprises a mesh, the apertures between the wires extend through the mesh in a thickness direction of the mesh. The thickness of the mesh may be, for example, between about 0.1 mm and about 2 mm, preferably between about 0.2 mm and about 1 mm. Thicker meshes tend to be less deformable and may add to weight of the sensored insulation plug more than necessary. Wires forming the mesh may have diameters, for example, of 0.05 mm or more, 0.2 mm or more, 0.5 mm or more, or 1.0 mm or more.

Where the testpoint electrode comprises a sheet, the apertures in the sheet extend through the sheet in a thickness direction of the sheet. The thickness of the sheet may be, for example, between about 0.01 mm and about 0.5 mm, preferably between about 0.1 mm and about 0.3 mm. Thicker sheets may add more weight and more cost than necessary.

For viscosities of the insulating material of less than about 20,000 mPa·s at 60° C., the size of the apertures in the mesh or in the sheet may advantageously be chosen to be at least about 0.1 mm in their shortest extensions. In certain embodiments the apertures have respective sizes of between 0.05 mm and 2 mm, as measured in the shortest extension of each aperture. In certain embodiments the size of the apertures is 0.1 mm or greater, or 0.5 mm or greater, in their shortest extension. The extension of an aperture as used herein is measured along the surface of the mesh or sheet, not in their thickness direction, i.e. not orthogonal to the surface of the mesh or sheet. Apertures having these sizes are believed to be more consistently filled with liquid insulating material, such that insulating material in the apertures can act as "bridges" between portions of the insulating material on opposite sides of the mesh or the sheet, as the case may be.

Within the limits outlined above, it is generally preferred for the mesh or sheet to have more smaller apertures, as opposed to fewer larger apertures, as this is believed to enhance cohesion between portions of the insulating material on opposite sides of the mesh or sheet. In certain embodiments of the sensored insulation plug described herein, the mesh of conductive wires of the testpoint electrode forms one thousand or more apertures. In certain embodiments the conductive sheet of the testpoint electrode forms one thousand or more apertures. A large number of apertures, like one thousand or more apertures, provides a large number of "bridges" between portions of the insulating material on opposite sides of the mesh or sheet and can thereby enhance cohesion and reduce the risk of delamination of insulating material at the testpoint electrode.

Besides the size of the apertures it is also the number of apertures in the mesh or sheet which determines how well portions of the casting material on opposite sides of the mesh or sheet are connected with each other. Under these aspects more apertures are desirable, but this needs to be balanced against the effect of reducing the surface of the testpoint electrode by having more apertures, which normally reduces the capacitance of the testpoint capacitor.

In use, when not grounded, the detection contact will be on a certain electrical potential, typically a few volts. Certain regulations require, however, that all external surfaces of a separable connector, including external surfaces of an insulation plug inserted into it, be on ground potential. The outer surface of a separable connector (excluding an insulation plug) is often formed by a conductive layer that is electrically connected to ground. In order to comply with the regulations, the detection contact may be covered by a cover (the "detection contact cover") that is electrically conductive and mechanically and electrically contacts the conductive layer on the outer surface of the separable connector. The detection contact cover is thereby connected to electrical ground, making the separable connector comply with the regulations. Such covers have been used for years. Many types of such covers were made from elastic, electrically conductive material (such as conductive rubber) and were attached to the separable connector by being radially expanded, placed, and by their contraction they gripped the surface of the separable connector containing the rear cavity. The grip established an electrical contact between the grounded conductive surface of the separable connector and the conductive cover.

In certain embodiments the detection contact is comprised in a conductive tube, extending from an axial end face of the low-voltage end portion of the plug body along the plug axis towards an opposed high-voltage end portion of the plug body. In some of these embodiments the sensored insulation plug comprises an electrically conductive detection contact cover having a fixation protrusion for attaching the detection contact cover to the plug body, wherein the fixation protrusion is arranged in the conductive tube and is mechanically engaged and electrically connected with the conductive tube such as to attach the detection contact cover to the conductive tube. Fixing the cover to the detection contact via the fixation protrusion is a simple and cost-effective way of providing a mechanical and electrical connection of the cover to the detection contact and attach the cover to the remainder of the sensored insulation plug.

In certain embodiments the conductive tube has an inner thread, and the fixation protrusion has a thread that can be engaged with the inner thread of the conductive tube, thereby fixing the detection contact cover to the insulation plug and connecting it electrically with the detection contact.

Alternatively, a detection contact cover can be attached to the plug body magnetically. Where the detection contact is made of, or comprises, a magnetic metal like, for example, iron or magnetic steel, the detection contact cover may comprise a magnet, such as a magnet of neodymium iron boron, that attracts the detection contact and thereby magnetically attaches the cover to the detection contact. The magnetic attachment may imply a surface contact between the detection contact and the cover, which surface contact may establish an electrical connection between the detection contact and the cover. Grounding the cover also grounds the detection contact.

Similarly, the detection contact cover may comprise a magnetic metal and the detection contact may comprise a magnet, such that the magnet attracts the magnetic metal of the detection contact cover and thereby magnetically attaches the cover to the detection contact. Again, the magnetic attachment may imply a surface contact between the detection contact and the cover, which surface contact may establish an electrical connection between the detection contact and the cover.

Instead of the magnet being comprised in the detection contact, the magnet may be comprised in the sensored insulation plug but arranged separately from the detection contact. The magnet may be arranged, for example, at an axial end face of the low-voltage end portion of the plug body. Advantageously the magnet is arranged in the vicinity of the detection contact, but it may be placed further away from the detection contact.

Independent of the location of the magnet, it may be advantageous to embed the magnet in a non-corroding material. This may prevent corrosion of the magnet. IN such arrangements the depth of embedding will be chosen rather shallow such that the magnet can still exert adequate magnetic force on its counter element no hold the detection contact cover in place.

Where the detection contact cover has a cover body made of a conductive rubber, for example, the detection contact cover may also comprise a magnet. In certain of such embodiments a surface of the magnet is exposed. In other embodiments, the magnet is embedded in the cover body such that no surface of the magnet is exposed. This helps protect the magnet from environmental impacts.

Where the magnet is arranged in the plug body of sensored insulation plug, the magnet may also be embedded such as to protect it from the environment. In certain embodiments, the magnet is embedded in the plug body such that no surface of the magnet is exposed.

The counter element of the magnet, i.e. an element of a magnetic metal, may be embedded on the cover or in the plug body in a similar manner as the magnet. Where the counter element is embedded in the plug body, the counter element may be electrically connected to the detection contact.

Hence in certain embodiments of the sensored insulation plug according to the present disclosure the sensored insulation plug comprises an electrically conductive detection contact cover comprising a metallic portion, wherein the metallic portion or the plug body or the detection contact comprises a magnet, and wherein the detection contact cover is attached to the plug body by the magnet. A magnetic attachment of the detection contact cover to the remainder of the sensored insulation plug may allow for the cover to be easier to remove from the detection contact using a hotstick than covers using other attachment mechanisms. Since magnets are often electrically conductive, a magnet can serve as both the detection contact and attachment means for the conductive cover.

Independent of the way of attachment of the cover to the remainder of the sensored insulation plug, the electrically conductive detection contact cover can be used to connect the detection contact to electrical ground. The cover is grounded through its surface contact with a grounded outer surface of the separable connector, or alternatively, or in addition, through a dedicated grounding wire. In certain scenarios it is important for the detection contact to be on ground as well. Therefore, in certain embodiments, the detection contact is connected to electrical ground via the electrically conductive detection contact cover.

The signal voltage of the sensing voltage divider varies proportionally with the elevated voltage and can thus be used to sense the elevated voltage of the connection element of the separable connector. A signal wire is often used to lead the signal voltage to a location outside the sensored insulation plug, such as to a so-called RTU ("remote terminal unit"), for measuring the signal voltage and deriving the elevated voltage from it. A sensored insulation plug may be considered more reliable if the signal wire is not connected to the sensored insulation plug by a connector on or close to the sensored insulation plug. Hence in certain embodiments of a sensored insulation plug according to the present disclosure a continuous signal wire of some length (e.g. at least 1 meter or at least 5 meters) extends from inside the plug body to a connector outside the plug body that can be connected directly to an RTU.

Sensored insulation plugs are engaged with the connection element by turning the sensored insulation plug by several revolutions about the plug axis while the sensored insulation plug is arranged in the rear cavity of the separable connector. Turning the sensored insulation plug with a loose, long signal wire on it often results in the signal wire getting entangled. It may therefore be advantageous to keep the excess length of the signal wire in a fixed manner on the plug body so that it is turned with the plug body when engaging the sensored insulation plug with the connection element by turning the plug body. A wire holder, such as a reel, for example, can be externally attached (i.e. attached to an outer surface) to the plug body on which an excess length of a signal wire can be kept and held in a fixed spatial relation to the plug body while turning the plug body.

Therefore, in an aspect of the present disclosure, the sensored insulation plug as described herein further comprises a) a signal wire electrically connected to the sensing electrode, the signal wire having an excess wire portion arranged outside the plug body, and b) a wire holder, externally attached to the plug body or to the detection contact, for holding the excess wire portion in fixed spatial relation to the plug body.

The wire holder may not have any use after installing the sensored insulation plug and may be discarded. It may be advantageous for the wire holder to be made of a low-cost, easily disposable, yet environmentally-friendly and sustainable material, such as cardboard.

It is noted that the concept of an excess wire holder attached to the plug body can be applied to different types of sensored insulation plugs, and that it is not limited to sensored insulation plugs having a detection contact and/or having a testpoint electrode as described herein.

In certain embodiments, the wire holder is a reel. A reel allows to wind up or to coil the excess wire portion in a space-saving manner. The reel may be of a rotationally-symmetric shape. Its symmetry axis may be aligned with the plug axis. In certain of these embodiments, the excess wire portion is coiled on the reel. In other embodiments, such as during assembly of the sensored insulation plug and before storing the excess wire portion, the excess wire portion is not yet coiled on the reel. Coiling on a reel provides a space-saving and easy-to-rotate arrangement of the excess wire portion.

Sensored insulation plugs according to the present disclosure can advantageously be used in power distribution networks for high-precision sensing of the elevated voltage at a specific location of a power line, e.g. at a switchgear or at a transformer. Where a separable connector is used to connect a power cable to a switchgear or to a transformer, the sensored insulation plug can be inserted into the rear cavity of the connector. By replacing an insulation plug in a separable connector with a the sensored insulation plug as described herein, the separable connector can be upgraded to now comprise a voltage testpoint formed by the detection contact. The voltage testpoint facilitates voltage detection, for example using a hotstick, while the separable connector remains connected, and simultaneously allows for high-precision voltage sensing. The present disclosure therefore also provides a power distribution network for distributing electrical power at medium or high voltages, the network comprising a) a power cable for conducting electrical energy in the power distribution network at an elevated voltage;

b) a separable connector mounted to an end of the power cable and having a rear cavity and a connection element on elevated voltage electrically connected to the power cable and accessible through the rear cavity; and c) a sensored insulation plug as described herein, inserted into the rear cavity to insulate the connection element and to detect and sense the elevated voltage of the connection element, wherein the high-voltage electrode is directly electrically connected with the connection element.

BRIEF DESCRIPTION OF THE FIGURES

The invention will now be described in more detail with reference to the following Figures exemplifying particular embodiments of the invention.

DETAILED DESCRIPTION

Figure 1:
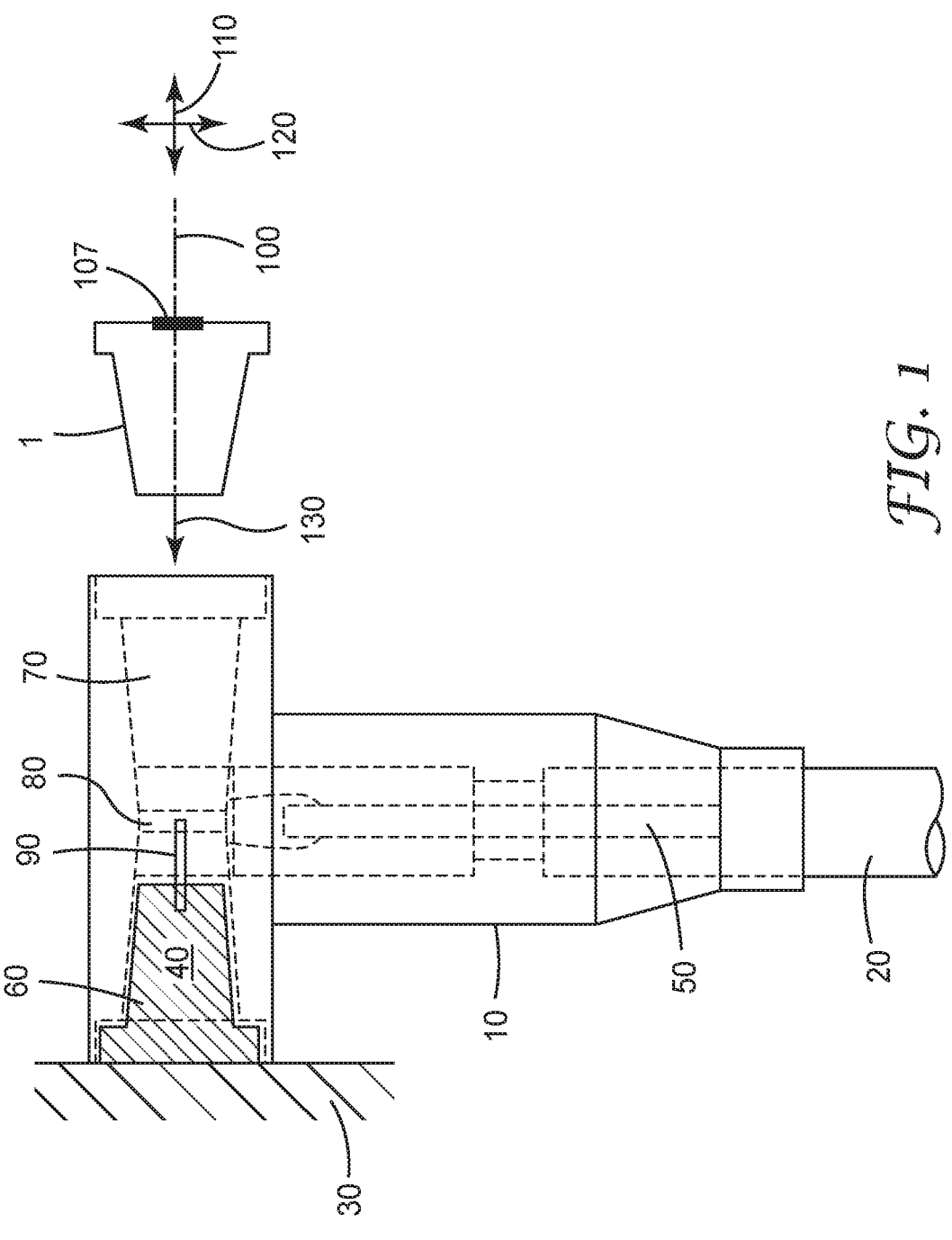
FIG. 1 Sectional view of a separable connector and a first sensored insulation plug according to the present disclosure.

The sectional view of FIG. 1 illustrates a separable connector 10 and a first sensored insulation plug 1 according to the present disclosure. The separable connector 10 is arranged at an end of a medium-voltage power cable 20 and connects, via a bushing 40, the power-carrying central conductor 50 of the cable 20 to a medium-voltage switchgear 30 in a power distribution network of a national grid.

The separable connector 10 is a T-shaped separable connector 10 and comprises a front cavity 60 for receiving the bushing 40, and a rear cavity 70 for receiving an insulation plug of a matching shape. The insulation plug may be a traditional insulation plug without elements of a sensor or a sensored insulation plug 1 according to the present disclosure, shown in FIG. 1 to the right of the rear cavity 70, before being inserted into the rear cavity 70. A traditional insulation plug and a sensored insulation plug 1 according to the present disclosure both serve to electrically insulate a connection element 80 of the separable connector 10, which is electrically connected to the central conductor 50 of the cable 20 and can be electrically and mechanically connected to a conductive component of the bushing 40 via a threaded stud 90. In use, the connection element 80 is on the elevated voltage of the central conductor 50 of the cable.

The first sensored insulation plug 1, just like a traditional insulation plug, has an overall frustoconical outer shape, generally rotationally symmetric about a plug axis 100 which defines axial directions 110 and radial directions 120, which are directions orthogonal to the axial directions 110. The sensored insulation plug 1 can be inserted into the rear cavity 70 by moving it axially in an axial insertion direction 130 into the rear cavity 70 where it is turned by several revolutions about the plug axis 100 to be threadedly engaged—and thereby electrically connected—with the connection element 80 on elevated voltage. The geometry of the sensored insulation plug 1 is adapted to conform to IEEE standard 386 to be suitable for a greater number of separable connectors. Depending on where the sensored insulation plug 1 is to be used, it could alternatively be adapted to conform to other standards or be adapted to fit into the most common types of separable connectors in a specific area of the world.

The sensored insulation plug 1 comprises a primary capacitor and a testpoint capacitor, which can both be electrically connected to the connection element 80 on elevated voltage. The primary capacitor is operable as a high-voltage capacitor in a sensing voltage divider for sensing the elevated voltage, and the testpoint capacitor is operable as a high-voltage capacitor in a detection voltage divider for detecting the elevated voltage.

The sensored insulation plug 1 comprises, at its low-voltage end portion, a detection contact 107 that is accessible for being contacted by a hotstick via which the elevated voltage can be detected and indicated to a human installer.

Figure 2:
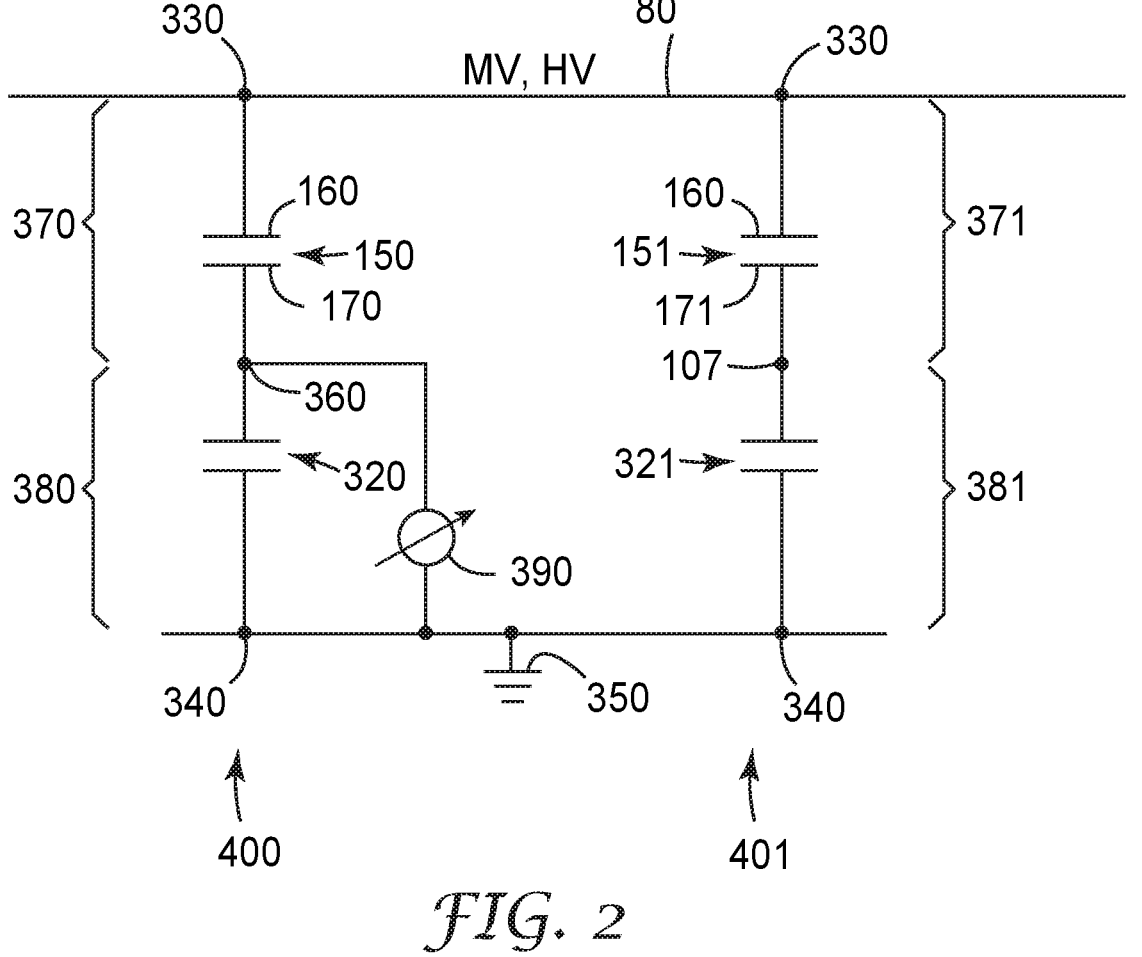
FIG. 2 Circuit diagram of a voltage divider assembly in which a sensored insulation plug according to the present disclosure can be used.

FIG. 2 is a circuit diagram of a sensing voltage divider 400 for sensing the elevated voltage of the separable connector 10 at high precision and of a detection voltage divider 401 for detecting the elevated voltage at lower precision in which the sensored insulation plug 1 of the present disclosure can be used.

The sensing voltage divider 400 for sensing the elevated voltage of the separable connector is shown electrically connected to a connection element 80 of the separable connector 10 on medium or high (i.e. elevated) voltage. The sensing voltage divider 400 comprises a high-voltage capacitor 150, corresponding to the primary capacitor 150 in the sensored insulation plug 1 described below, and a low-voltage capacitor 320. These two capacitors are electrically connected in series between a high-voltage contact 330 and a grounding contact 340, held on electrical ground 350.

The high-voltage contact 330 facilitates electrical connection to the connection element 80 on elevated voltage. The grounding contact 340 facilitates connection of the sensing voltage divider 400 to electrical ground 350.

A signal contact 360 is arranged electrically between a high-voltage portion 370 and a low-voltage portion 380 of the sensing voltage divider 400. At the signal contact 360, a divided voltage, also referred to herein as the signal voltage, can be picked up, which varies proportionally with the elevated voltage of the connection element 80. The dividing ratio, i.e. the proportionality factor between the elevated voltage and the signal voltage, depends on the ratio of the total impedance of the high-voltage portion 370 to the total impedance of the low-voltage portion 380 of the voltage divider 400. By measuring the signal voltage of the signal contact 360 using a voltmeter 390 and applying the proportionality factor, the elevated voltage of the connection element 80 can be sensed.

In the illustrated embodiment, the high-voltage portion 370 comprises only one capacitor, namely the primary capacitor 150, with its high-voltage electrode 160 and its sensing electrode 170. In other embodiments the high-voltage portion 370 may comprise, beyond the primary capacitor 150, one or more further capacitors. It may comprise, beyond the primary capacitor 150, one or more further impedance elements, such as one or more resistors and/or one or more inductors.

Similarly, in the illustrated sensing voltage divider 400, the low-voltage portion 380 comprises only one capacitor, namely the low-voltage capacitor 320. In other embodiments the low-voltage portion 380 may comprise, beyond the low-voltage capacitor 320, one or more further capacitors. It may comprise, beyond the low-voltage capacitor 320, one or more further impedance elements, such as one or more resistors and/or one or more inductors.

The detection voltage divider 401 for detecting the elevated voltage of the separable connector 10 is also electrically connected to the connection element 80 of the separable connector 10 on medium or high (i.e. elevated) voltage. The detection voltage divider 401 comprises a high-voltage capacitor 151, corresponding to the testpoint capacitor 151 in the sensed insulation plug 1 described below, and a low-voltage capacitor 321. These two capacitors 151, 321 are electrically connected in series between a high-voltage contact 330 and a grounding contact 340, held on electrical ground 350.

The high-voltage contact 330 facilitates electrical connection to the connection element 80 on elevated voltage. The grounding contact 340 facilitates connection of the detection voltage divider 401 to electrical ground 350.

A detection contact 107 is arranged electrically between a high-voltage portion 371 and a low-voltage portion 381 of the detection voltage divider 401. At the detection contact 107, a divided voltage, also referred to herein as the detection voltage, can be picked up, which varies proportionally with the elevated voltage of the connection element 80. The dividing ratio, i.e. the proportionality factor between the elevated voltage and the detection voltage, depends on the ratio of the total impedance of the high-voltage portion 371 to the total impedance of the low-voltage portion 381 of the detection voltage divider 401. By measuring the detection voltage of the detection contact 107 and applying the proportionality factor, the presence or absence of the elevated voltage of the connection element 80 at the high-voltage contact 330 can be detected.

In the illustrated embodiment, the high-voltage portion 371 of the detection voltage divider 401 comprises only one capacitor, namely the testpoint capacitor 151, with its high-voltage electrode 160 and its testpoint electrode 171. The high-voltage electrode 160 of the sensing voltage divider 400 and the high-voltage electrode 160 of the detection voltage divider 401 are physically identical and on the same voltage.

In other embodiments the high-voltage portion 371 may comprise, beyond the testpoint capacitor 151, one or more further capacitors. It may comprise, beyond the primary capacitor 151, one or more further impedance elements, such as one or more resistors and/or one or more inductors.

Similarly, in the illustrated detection voltage divider 401, the low-voltage portion 381 comprises only one capacitor, namely the low-voltage capacitor 321. In other embodiments the low-voltage portion 381 may comprise, beyond the low-voltage capacitor 321, one or more further capacitors. It may comprise, beyond the low-voltage capacitor 321, one or more further impedance elements, such as one or more resistors and/or one or more inductors.

The primary capacitor 150 and the testpoint capacitor 151 are comprised in the first sensored insulation plug 1. However, not all remaining elements of the sensing voltage divider 400 and of the detection voltage divider 401 may be comprised in the sensored insulation plug 1. In certain embodiments, the low-voltage capacitors 320 and 321 are not comprised in the sensored insulation plug 1. In other embodiments one or both of the low-voltage capacitors 320, 321 are comprised in the sensored insulation plug 1.

The low-voltage capacitor 321 of the detection voltage divider 401 may be comprised in the hotstick which contacts the detection contact 107. However, some hotsticks do not provide an ohmic connection to electrical ground 350, instead these hotsticks use their floating capacitance to ground as the low-voltage capacitor 321 of the detection voltage divider 401.

Figure 3:
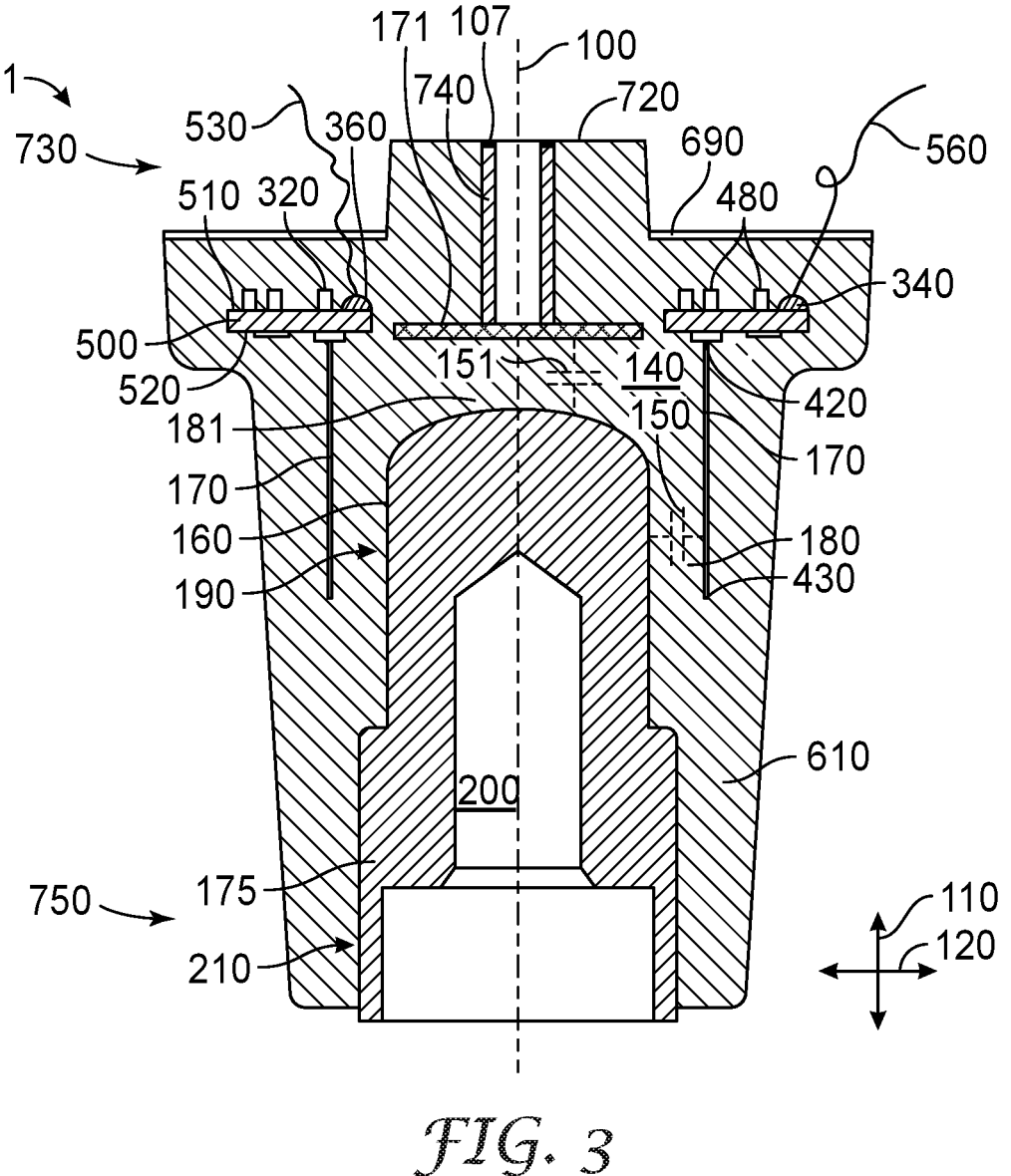
FIG. 3 Sectional view of the first sensored insulation plug according to the present disclosure.

FIG. 3 shows, in a sectional view, the first sensored insulation plug 1 according to the present disclosure of FIG. 1 in greater detail. The sensored insulation plug 1 comprises a plug body 140 of an insulating material 610, namely an electrically insulating hardened resin 610, a primary capacitor 150 formed by a high-voltage electrode 160 and a tubular sensing electrode 170, and a testpoint capacitor 151 formed by the high-voltage electrode 160 and a disk-shaped testpoint electrode 171.

The high-voltage electrode 160, the sensing electrode 170, and the testpoint electrode 171 are rotationally symmetric about a plug axis 100. The dielectric of the primary capacitor 150 is formed by a first portion 180 of the insulating material 610 of the plug body 140, located between the high-voltage electrode 160 and the sensing electrode 170. The dielectric of the testpoint capacitor 151 is formed by a second portion 181 of the insulating material 610 of the plug body 140, located between the high-voltage electrode 160 and the testpoint electrode 171.

The high-voltage electrode 160 is comprised in an electrode portion 190 of a contact piece 175 made of conductive metal. The contact piece 175 is generally rotationally symmetric about the plug axis 100 and has, further to the electrode portion 190, an engagement portion 210 for mechanical engagement with an intermediate element connecting the contact piece 175 electrically with the connection element 80 of the separable connector 10. The electrode portion 190 forms the high-voltage electrode 160. The engagement portion 210 and the electrode portion 190 are formed as a single piece of metal.

The contact piece 175 comprises a threaded recess 200 to connectingly engage a stud 90 for mechanical and direct, i.e. ohmic, electrical connection of the contact piece 175 to the connection element 80 of the separable connector 10. In use, the entire contact piece 175 and in particular its electrode portion 190 are on the elevated voltage of the connection element 80 of the separable connector 10.

The sensing electrode 170 is a mesh 170 of conductive stainless-steel wires. It has a generally tubular shape and is arranged concentrically around the high-voltage electrode 160. A proximal edge 420 of the sensing electrode 170 is attached to a supporting circuit board 500, while a distal edge 430 is axially spaced from the circuit board 500 by the length of the sensing electrode 170. The length of the sensing electrode 170 is its extension in axial direction 110.

The testpoint electrode 171 is also a mesh 171 of conductive stainless-steel wires forming apertures between them. The testpoint electrode 171 is flat and has the shape of a circular disk, centered on the plug axis 100. The apertures extend through the testpoint electrode 171 in its thickness direction, which is an axial direction 110 in the illustrated embodiment. In axial directions 110, the testpoint electrode 171 is arranged opposite to the high-voltage electrode 160, spaced by a couple of millimeters or centimeters. The space between the testpoint electrode 171 and the high-voltage electrode 160 is filled with insulating material 610, so that the testpoint electrode 171, the high-voltage electrode 160 and the insulating material 610 between them form a capacitor, namely the testpoint capacitor 151.

The sensing electrode 170 and the testpoint electrode 171 are each completely surrounded by the insulating material 610 of the plug body 140. In other words, they are each embedded in the plug body 140. The major surfaces of the sensing electrode 170 and the major surfaces of the testpoint electrode 171 are in surface contact with the surrounding insulating material 610 of the plug body 140 in which the sensing electrode 170 and the testpoint electrode 171 are embedded.

In particular, a first portion 180 of the insulating material 610 is present between the sensing electrode 170 and the high-voltage electrode 160, so that the first portion 180 of the insulating material 610 forms a dielectric of the primary capacitor 150, and a second portion 181 of the insulating material 610 is present between the testpoint electrode 171 and the high-voltage electrode 160, so that that second portion 181 of the insulating material 610 forms a dielectric of the testpoint capacitor 151.

The insulating material 610 of the plug body 140 is a hardened epoxy resin. In manufacturing, the resin in its liquid state is cast or molded around the high-voltage electrode 160, the sensing electrode 170 and the testpoint electrode 171 in a mold that determines the outer shape of the sensored insulation plug 1. A major part of the resin 610 flows under pressure towards and around the mesh 170 of the sensing electrode 170 and towards around the mesh 171 of the testpoint electrode 171, and portions of the resin fill the apertures between the wires of the respective meshes 170, 171. These portions thus connect insulating material 610 radially inside the sensing electrode 170 with insulating material 610 radially outside the sensing electrode 170 and connect insulating material 610 above the testpoint electrode 171 with insulating material 610 below the testpoint electrode 171. "Above" and "below" refer to the orientation of the sensored insulation plug as drawn in FIG. 3. The resin 610 is then cured or hardened to solidify, resulting in a solid insulating plug body 140 in which the sensing electrode 170 and the testpoint electrode 171 are embedded.

The apertures between the wires of the respective meshes 170, 171 facilitate, during production of the sensored insulation plug 1, the flow of liquid insulating material 610 into the space between the sensing electrode 170 and the high-voltage electrode 160 and into the space between the testpoint electrode 171 and the high-voltage electrode 160, respectively. Portions of the insulating material 610 remaining in the apertures later connect insulating material 610 on one side of the respective electrode 170, 171 with insulating material 610 on the other side of the respective electrode 170, 171.

The electrical breakdown strength of the insulating material 610 is high enough to reliably prevent electric discharges between the high-voltage electrode 160 on elevated voltage and the sensing electrode 170 and between the high-voltage electrode 160 on elevated voltage and the testpoint electrode 171.

The sensing electrode 170 is mechanically supported by a flat, rigid circuit board 500 of generally annular shape, arranged concentrically with the plug axis 100. The circuit board 500 comprises conductive traces by which electric and electronic components 480, such as the sensing electrode 170, arranged respectively on the upper surface 510 and on the lower surface 520 of the circuit board 500, are electrically connected with each other. In particular, a low-voltage capacitor 320 is arranged on the upper surface 510 of the circuit board 500. This low-voltage capacitor 320 is electrically connected in series between the sensing electrode 170 and a grounding contact 340 held on electrical ground 350. The grounding contact 340 on the circuit board 500 can be connected to an external grounding point via a grounding wire 560 leading from the grounding contact 340 through an aperture in a grounded conductive lid 690 to outside the sensored insulation plug 1.

The low-voltage capacitor 320 forms the low-voltage portion 380 of a sensing voltage divider 400 for sensing the elevated voltage, with the primary capacitor 150 forming the high-voltage portion 370 of the sensing voltage divider 400, as shown in FIG. 2.

The circuit board 500 is embedded in the plug body 140. The electrically conductive, grounded lid 690 helps in shielding the electric and electronic components 480 on the circuit board 500 against external electrical fields.

The divided voltage of the sensing voltage divider 400 can be accessed at a signal contact 360 on the circuit board 500. A signal wire 530 makes the signal voltage available outside the sensored insulation plug 1, it is led through an aperture in the grounded conductive lid 690. As is generally known for voltage dividers, the signal voltage varies proportionally with the elevated voltage of the high-voltage electrode 160, so that the elevated voltage of the high-voltage electrode 160—and thereby the elevated voltage of the connection element 80 of the separable connector 10—can be determined by measuring the signal voltage and multiplying it with the dividing ratio of the sensing voltage divider 400.

The voltage of the testpoint electrode 171, i.e. the detection voltage, can be picked up at a detection contact 107, arranged on an axial end face 720 of a low-voltage end portion 730 of the sensored insulation plug 1. The detection contact 107 is formed by an end portion of a conductive hollow cylindrical copper tube 740, the end portion of which is exposed and externally accessible at the end face 720. The tube 740 extends from the axial end face 720 along the plug axis 100 towards a high-voltage end portion 750 of the sensored insulation plug 1, and mechanically and electrically connects the testpoint electrode 171 with the detection contact 107. The central axis of the copper tube 740 is collinear with the plug axis 100, and the interior of the tube 740 is empty, while its radially outer surface is in surface contact with the insulating material 610 of the plug body 140.

The hollow conductive tube 740 can receive a pin-shaped or conical contact at the end of a hotstick, whereby an electrical contact is established. A detection voltage divider 401 is created by the serial electrical connection of the testpoint capacitor 151 and a grounded low-voltage capacitor 321 in the hotstick, or by the testpoint capacitor 151 and a "floating capacitor", formed between the hotstick contact and ground, with ambient air as dielectric. This detection voltage divider 401 is operable to detect presence or absence of elevated voltage on the high-voltage electrode 160 of the testpoint capacitor 151.

Figure 4:
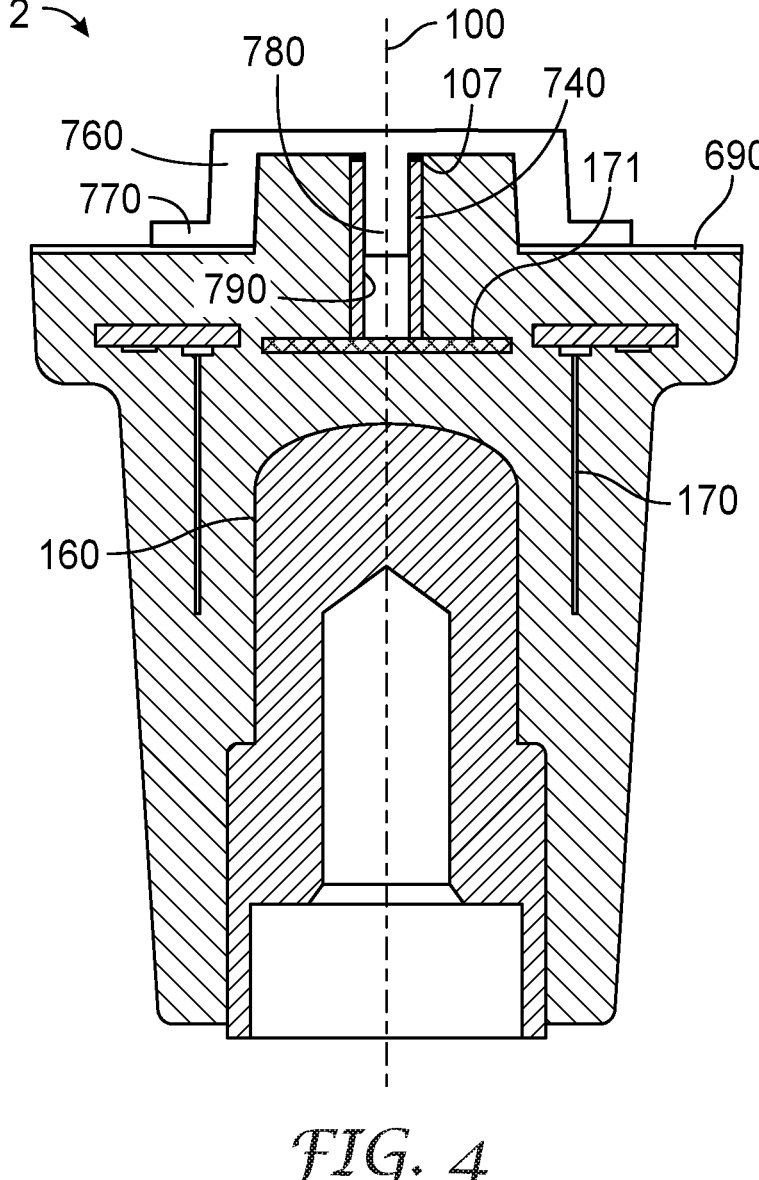
FIG. 4 Sectional view of a second sensored insulation plug according to the present disclosure, comprising a detection contact cover.

FIG. 4 is a sectional view of a second sensored insulation plug 2 according to the present disclosure. Certain details that are illustrated in FIG. 3 are not shown in FIG. 4 for clarity.

The second sensored insulation plug 2 is similar to the first sensored insulation plug 1 shown in FIG. 3, except that it further comprises a detection contact cover 760 for holding the detection contact 107 on electrical ground. The detection contact cover 760 is rotationally symmetric about plug axis 100 and is made of a conductive polymeric material. Its peripheral portion 770 is in surface contact with the grounded lid 690. At its center, the detection contact cover 760 comprises a fixation protrusion 780 that is received in the hollow tube 740 and is in surface contact with an inner surface 790 of the conductive tube 740. The surface contact provides both an electrical connection and a mechanical engagement between the detection contact cover 760 and the tube 740. The mechanical engagement holds the detection contact cover 760 in place, while the electrical connection keeps the detection contact 107 and the tube 740 on electrical ground, as the tube 740 is connected to the grounded lid 690 via the conductive cover 760.

The outer diameter of the fixation protrusion 780 of the detection contact cover 760 is slightly larger than the inner diameter of the conductive tube 740. When attaching the detection contact cover 760, the fixation protrusion 780 is urged into the interior of the tube 740 and thereby elastically compressed. In trying to expand to its uncompressed shape the fixation protrusion 780 creates friction which holds the fixation protrusion 780 in the tube 740 and keeps the detection contact cover 760 in place.

Figure 5:
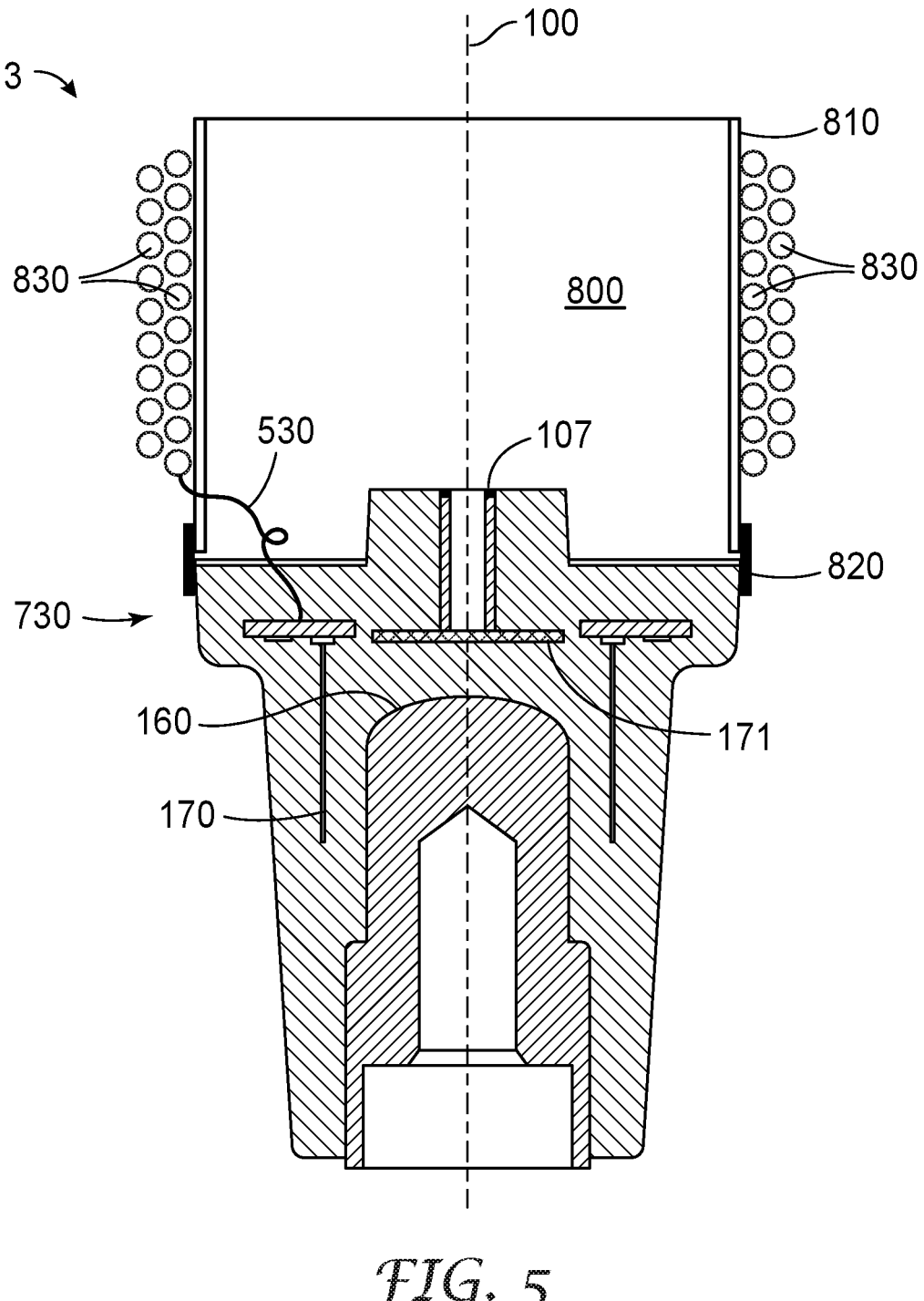
FIG. 5 Sectional view of a third sensored insulation plug according to the present disclosure, comprising a cable holder.

FIG. 5 illustrates, in another sectional view, a third sensored insulation plug 3 comprising a cable holder 800. The plug body 140, the high-voltage electrode 160, the sensing electrode 170 and the testpoint electrode 171 are similar to the corresponding elements of the first and the second sensored insulation plugs 1, 2. The cable holder 800 comprises a cardboard reel 810 which is rotationally symmetric with respect to plug axis 100 and arranged coaxially over the low-voltage end portion 730 of the sensored insulation plug 3. At its lower end, the cardboard reel 810 is circumferentially attached to the plug body 140 by an adhesive tape 820.

The signal voltage of the sensing electrode 170 is led to outside the plug body 140 by a signal wire 530. The signal wire 530 may have a considerable excess length, such as a meter or a few meters, as in the embodiment shown in the Figure. Therefore, the excess wire portion 830 may become entangled when the sensored insulation plug 3 is turned by several revolutions about the plug axis 100 to engage it with the separable connector 10. The entanglement can be avoided by holding the excess wire portion 830 in fixed spatial relation to the plug body 140 while turning the sensored insulation plug 3. This is achieved by having the excess wire portion 830 coiled on the reel 810 before and during installation of the sensored insulation plug 3 in a separable connector 10.

In its interior, the cylindrical shape of the reel 810 leaves space for a hotstick contact to make contact with the detection contact 107 in order to detect the presence or absence of the elevated voltage of the separable connector 10. This facilitates voltage detection on the sensored insulation plug 3 even before the sensing electrode 170 is connected to a sensing system.

An excess wire portion of a grounding wire 560 may also be coiled on the reel 810 of the cable holder 800.

The invention claimed is:

1. Sensored insulation plug for being inserted into a rear cavity of a medium voltage or high-voltage separable connector in a power distribution network of a national grid, and operable to insulate a connection element of the separable connector on an elevated voltage and to sense the elevated voltage, the sensored insulation plug comprising a) a plug body formed by a solidified insulating material, b) an externally accessible detection contact, c) a primary capacitor, operable as a high-voltage capacitor in a sensing voltage divider for sensing the elevated voltage, the primary capacitor having i) a high-voltage electrode for direct electrical connection to the elevated voltage;

ii) a sensing electrode of a tubular shape, embedded in the plug body; and iii) a dielectric formed by a first portion of the insulating material arranged between the sensing electrode and the high-voltage electrode, and d) a testpoint capacitor, operable as a high-voltage capacitor in a detection voltage divider for detecting the elevated voltage and comprising i) the high-voltage electrode;

ii) a testpoint electrode, embedded in the plug body and electrically connected to the detection contact; and iii) a dielectric formed by a second portion of the insulating material arranged between the testpoint electrode and the high-voltage electrode, wherein the plug body comprises a high-voltage end portion and an opposed low-voltage end portion, and wherein the detection contact is arranged at an axial end face of the low-voltage end portion, and wherein the detection contact is comprised in a conductive tube, extending from the axial end face along the plug axis towards the high-voltage end portion.

2. Sensored insulation plug according to claim 1, wherein the plug body is rotationally symmetric about a plug axis, and wherein the high-voltage electrode and the sensing electrode are arranged concentrically around the plug axis, and wherein the sensing electrode is arranged around the high-voltage electrode.

3. Sensored insulation plug according to claim 1, wherein the plug body is rotationally symmetric about a plug axis, and wherein the testpoint electrode extends in a plane orthogonal to the plug axis.

4. Sensored insulation plug according to claim 1, wherein the testpoint electrode comprises a conductive sheet, comprising a plurality of apertures to allow portions of the insulating material on opposite sides of the sheet to be mechanically connected with each other by insulating material in the apertures while the insulating material solidifies and thereafter.

5. Sensored insulation plug according to claim 1, wherein the testpoint electrode comprises two opposed major surfaces, parallel to each other and lying in respective geometric planes, the respective geometric planes extending orthogonally to the plug axis.

6. Sensored insulation plug according to claim 1, wherein the sensored insulation plug comprises an electrically conductive detection contact cover having a fixation protrusion for attaching the detection contact cover to the plug body, wherein the fixation protrusion is arranged in the conductive tube and is mechanically engaged and electrically connected with the conductive tube to attach the detection contact cover to the conductive tube.

7. Sensored insulation plug according to claim 1, wherein the testpoint electrode comprises a mesh of conductive wires forming a plurality of apertures between the wires to allow portions of the insulating material on opposite sides of the mesh to be mechanically connected with each other by insulating material in the apertures while the insulating material solidifies and thereafter.

8. Sensored insulation plug according to claim 6, wherein the detection contact is connected to electrical ground via the electrically conductive detection contact cover.

9. Sensored insulation plug according to claim 1, wherein a thickness of the testpoint electrode is one tenth of its greatest extension in any direction orthogonal to its thickness direction or less.

10. Sensored insulation plug for being inserted into a rear cavity of a medium voltage or high-voltage separable connector in a power distribution network of a national grid, and operable to insulate a connection element of the separable connector on an elevated voltage and to sense the elevated voltage, the sensored insulation plug comprising a) a plug body formed by a solidified insulating material, b) an externally accessible detection contact,

c) a primary capacitor, operable as a high-voltage capacitor in a sensing voltage divider for sensing the elevated voltage, the primary capacitor having
   i) a high-voltage electrode for direct electrical connection to the elevated voltage;
   ii) a sensing electrode of a tubular shape, embedded in the plug body; and
   iii) a dielectric formed by a first portion of the insulating material arranged between the sensing electrode and the high-voltage electrode, and
d) a testpoint capacitor, operable as a high-voltage capacitor in a detection voltage divider for detecting the elevated voltage and comprising
   i) the high-voltage electrode;
   ii) a testpoint electrode, embedded in the plug body and electrically connected to the detection contact; and
   iii) a dielectric formed by a second portion of the insulating material arranged between the testpoint electrode and the high-voltage electrode, and further comprising
a signal wire electrically connected to the sensing electrode, the signal wire having an excess wire portion arranged outside the plug body, and
a wire holder, externally attached to the plug body or to the detection contact, for holding the excess wire portion in fixed spatial relation to the plug body.

11. Sensored insulation plug according to claim 10, wherein the wire holder is a reel, and wherein the excess wire portion is coiled on the reel.

12. Power distribution network for distributing electrical power at medium or high voltages, the network comprising
a) a power cable for conducting electrical energy in the power distribution network at an elevated voltage,
b) a separable connector, mounted to an end of the power cable and having a rear cavity and a connection element on elevated voltage, electrically connected to the power cable and accessible through the rear cavity; and
c) a sensored insulation plug according to claim 10, inserted into the rear cavity to insulate the connection element and to detect and sense the elevated voltage of the connection element,

28 wherein the high-voltage electrode is directly electrically connected with the connection element.

13. Sensored insulation plug for being inserted into a rear cavity of a medium voltage or high-voltage separable connector in a power distribution network of a national grid, and operable to insulate a connection element of the separable connector on an elevated voltage and to sense the elevated voltage,
the sensored insulation plug comprising
a) a plug body formed by a solidified insulating material,
b) an externally accessible detection contact,
c) a primary capacitor, operable as a high-voltage capacitor in a sensing voltage divider for sensing the elevated voltage, the primary capacitor having
   i) a high-voltage electrode for direct electrical connection to the elevated voltage;
   ii) a sensing electrode of a tubular shape, embedded in the plug body; and
   iii) a dielectric formed by a first portion of the insulating material arranged between the sensing electrode and the high-voltage electrode, and
d) a testpoint capacitor, operable as a high-voltage capacitor in a detection voltage divider for detecting the elevated voltage and comprising
   i) the high-voltage electrode;
   ii) a testpoint electrode, embedded in the plug body and electrically connected to the detection contact; and
   iii) a dielectric formed by a second portion of the insulating material arranged between the testpoint electrode and the high-voltage electrode, wherein the sensored insulation plug comprises an electrically conductive detection contact cover comprising a metallic portion, wherein the metallic portion or the plug body or the detection contact comprises a magnet, and wherein the detection contact cover is attached to the plug body by the magnet.

* * * * *